US011527618B2

(12) United States Patent
Venkatraman (10) Patent No.: US 11,527,618 B2
(45) Date of Patent: Dec. 13, 2022

(54) UP-DIFFUSION SUPPRESSION IN A POWER MOSFET

(71) Applicant: SEMICONDUCTOR COMPONENTS INDUSTRIES, LLC, Phoenix, AZ (US)

(72) Inventor: Prasad Venkatraman, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/948,806

(22) Filed: Oct. 1, 2020

(65) Prior Publication Data

US 2022/0020851 A1 Jan. 20, 2022

Related U.S. Application Data

(60) Provisional application No. 62/705,864, filed on Jul. 18, 2020.

(51) Int. Cl.
| | |
|---|---|
| *H01L 29/10* | (2006.01) |
| *H01L 29/78* | (2006.01) |
| *H01L 29/167* | (2006.01) |
| *H01L 29/66* | (2006.01) |
| *H01L 21/225* | (2006.01) |
| *H01L 21/265* | (2006.01) |
| *H01L 29/40* | (2006.01) |

(52) U.S. Cl.
CPC ...... *H01L 29/1095* (2013.01); *H01L 21/2253* (2013.01); *H01L 21/2652* (2013.01); *H01L 29/167* (2013.01); *H01L 29/407* (2013.01); *H01L 29/66734* (2013.01); *H01L 29/7813* (2013.01)

(58) Field of Classification Search
CPC ............. H01L 29/1095; H01L 21/2253; H01L 21/2652; H01L 29/167; H01L 29/407; H01L 29/66734; H01L 29/7813
USPC ........................................................ 257/330
See application file for complete search history.

(56) References Cited

U.S. PATENT DOCUMENTS

| | | | |
|---|---|---|---|
| 7,714,381 B2 | 5/2010 | Robb et al. | |
| 8,138,033 B2 | 3/2012 | Hossain et al. | |
| 8,207,035 B2 | 6/2012 | Robb et al. | |
| 9,520,475 B2 * | 12/2016 | Miyazaki | H01L 29/0615 |
| 10,109,719 B2 * | 10/2018 | Lee | H01L 29/1095 |
| 2003/0008460 A1 | 1/2003 | Darwish | |

(Continued)

FOREIGN PATENT DOCUMENTS

| | | | | |
|---|---|---|---|---|
| DE | 102005009000 A1 * | 9/2006 | ......... | H01L 29/0878 |
| WO | 2000072372 A1 | 11/2000 | | |

*Primary Examiner* — Mohammad M Hoque
(74) *Attorney, Agent, or Firm* — Brake Hughes Bellermann LLP (57) ABSTRACT

A substrate for fabricating a MOSFET device includes a first epitaxial layer disposed on a silicon wafer. The silicon wafer is doped with a first dopant. A second epitaxial layer is disposed on the first epitaxial layer. An ion-implanted capping layer is disposed in the first epitaxial layer. The ion-implanted capping layer is doped with a second dopant. The first dopant has a diffusion coefficient in silicon higher than a diffusion coefficient of the second dopant in silicon. The ion-implanted capping layer is configured to limit up-diffusion of the first dopant from the silicon wafer into the second epitaxial layer.

20 Claims, 9 Drawing Sheets

(56) References Cited

U.S. PATENT DOCUMENTS

| | | | |
|---|---|---|---|
| 2010/0244093 A1* | 9/2010 | Rahimo | H01L 29/7395 257/142 |
| 2014/0225185 A1 | 8/2014 | Su et al. | |
| 2014/0374793 A1* | 12/2014 | Miyazaki | H01L 29/66348 438/530 |
| 2015/0179441 A1* | 6/2015 | Onozawa | H01L 29/0619 257/109 |
| 2016/0268366 A1* | 9/2016 | Takishita | H01L 29/0615 |
| 2016/0359029 A1 | 12/2016 | Zeng et al. | |
| 2017/0271450 A1* | 9/2017 | Takahashi | H01L 21/26506 |
| 2022/0013635 A1* | 1/2022 | Tamura | H01L 29/1004 |

* cited by examiner

UP-DIFFUSION SUPPRESSION IN A POWER MOSFET

CROSS-REFERENCE TO RELATED APPLICATIONS

This application claims the benefit of U.S. Provisional Patent Application No. 62/705,864, filed on Jul. 18, 2020, the entire contents of which is incorporated herein by reference.

TECHNICAL FIELD

This description relates to semiconductor devices and fabrication technology. In particular, the description relates to fabrication of metal-oxide-semiconductor field-effect transistor (MOSFET) devices.

BACKGROUND

For power applications, a vertical channel or trench gate MOSFET may be preferred. In a vertical channel MOSFET, source, gate and drain regions are arrayed in a vertical direction of a semiconductor substrate (e.g., a highly doped silicon substrate). The source and drain terminals may be placed on opposite sides of a semiconductor substrate, and a gate electrode disposed in a groove or trench that is etched in the semiconductor substrate. This vertical configuration may be suitable for a power MOSFET device, as more area can be used for the channel of the MOSFET, which can increase the drain-to-source current rating and also can allow use of an epitaxial layer for the drain drift region to increase the device's voltage blocking capability. The relatively lightly doped) epitaxial layer is grown on the highly doped silicon substrate.

A measure of a MOSFET device's performance is given by the device's specific on-resistance (Rsp(on)) or resistance Rds(on) times a die area when the device is switched on. Lower Rsp(on) values correspond to lower drain to source resistance Rds(on) of the MOSFET device for a given die size. Another measure of the switching performance of a MOSFET device is given by its characteristic gate-drain charge "Miller charge" (Qgd), which determines how much voltage or power is needed to drive or turn-on the device.

Consideration is now being given to MOSFET device structures and fabrication processes. In particular, consideration is being given to MOSFET device structures or architectures with a view to lower specific on-resistance (Rsp(on)).

DESCRIPTION

An electronic device is made by doping semiconductor material regions of the device with n-type dopants (and/or p-type dopants). The type of dopant and the concentration profile of the dopant in the semiconductor material regions determines the electrical properties of semiconductor material regions in the electronic device. Common n-type dopants for silicon material include five-valent Group V elements such as phosphorus, arsenic, antimony, and bismuth. Common p-type dopants for silicon material include trivalent Group III elements such as boron, aluminum, gallium, indium. Different dopants have different thermal diffusion coefficients (diffusivity) in silicon. Dopants such as arsenic (As) and antimony (Sb) (i.e., the so-called slow diffusers) may have diffusivity that is about a tenth of the diffusivity of dopants such as phosphorus or boron (i.e., the so-called fast diffusers).

A MOSFET device is fabricated in a silicon substrate with a drift region of the device formed in a lightly doped device layer. The lightly doped device layer may be an overlayer (e.g., an epilayer) on a highly doped silicon substrate. Drain regions of the MOSFET device may be formed in the highly doped silicon substrate. Substrate resistance is a major component of the drain-source on resistance (Rds(on)) for power MOSFETs (e.g., low and medium voltage power MOSFETs).

Phosphorus can be used as the dopant for the silicon substrate to reduce the substrate resistance. However, phosphorus is a fast diffuser in silicon. Thermal processes used in fabricating a MOSFET device on the silicon substrate can cause significant up-diffusion of phosphorus from the silicon substrate into the lightly doped device layer in which a drift region of the MOSFET device is formed. The up-diffusion can result in a relatively slowly graded dopant profile in the drift region of the MOSFET device and increase Rds(on) of the MOSFET device.

Further, highly doped silicon substrates can have large substrate-to-substrate variations in doping concentration (in other words, substrate resistivity control is poor). Correspondingly, the amount of phosphorus up-diffusion may vary from substrate to substrate, making it difficult to design or use semiconductor device fabrication processes (e.g., thermal processes) to control the dopant profiles in the drift regions of the MOSFET devices fabricated on different substrates (e.g., in semiconductor device fabrication facility).

In accordance with the principles of the present disclosure, an ion-implanted capping layer is disposed in a first epitaxial layer between a lightly doped device layer and a highly doped silicon substrate. The lightly doped device layer and the highly doped silicon substrate may be doped with a fast diffusing dopant (e.g., phosphorus). The ion-implanted capping layer (an n+ doped buried layer) may be an implanted layer formed by implanting a slow diffusing dopant species (e.g., arsenic, antimony) of a same conductivity type (e.g., n-type) as the highly doped silicon substrate.

The amount of slow diffusing dopant species (e.g., arsenic, antimony) in the ion-implanted capping layer is accurately determined by the ion implantation dose. A net dopant profile in the lightly doped device layer is determined by the amount of the dopant (e.g., phosphorus) incorporated during epitaxial growth of the lightly doped device layer and a limited up-diffusion of the slow diffusing dopant species (e.g., arsenic) from the ion-implanted capping layer into the lightly doped device layer. A thickness of the first epitaxial layer (including the ion-implanted capping layer) may contain the dopant (e.g., phosphorus) up-diffusion from the highly doped silicon substrate so that the dopant (e.g., phosphorus) up-diffusion does not affect (or has little effect on) the net dopant profile in the lightly doped device layer.

In example MOSFET devices, since the implanted dopant is arsenic, which has a much lower diffusivity than phosphorus, the net doping profile in the lightly doped device layer will have only a small contribution of a short diffusion tail from ion-implanted capping layer into the lightly doped device layer. The net doping profile in the lightly doped device layer may have a much steeper dopant gradient (of arsenic) transitioning into the lightly doped device layer than the phosphorus up-diffusion and will result in lower Rds(on) for the MOSFET devices.

The highly doped silicon substrate may be doped, for example, with n-type dopants in a range of about $10^{+19}$ to $10^{+20}$ atoms/cm$^3$ or higher. The lightly doped device layer may be doped, for example, with n-type dopants in a range of about $10^{+14}$ to $10^{+18}$ atoms/cm$^3$ or lower. The ion-implanted capping layer may be doped with n-type dopants, for example, to an intermediate level between the doping levels of the highly doped silicon substrate and the doping levels of the lightly doped device layer. In an example implementation, the ion-implanted capping layer may be doped with n-type dopants (e.g., arsenic, antimony) with an as-implanted peak concentration, for example, in a range of about $10^{+18}$ to $10^{+20}$ atoms/cm$^3$.

Figure 1:
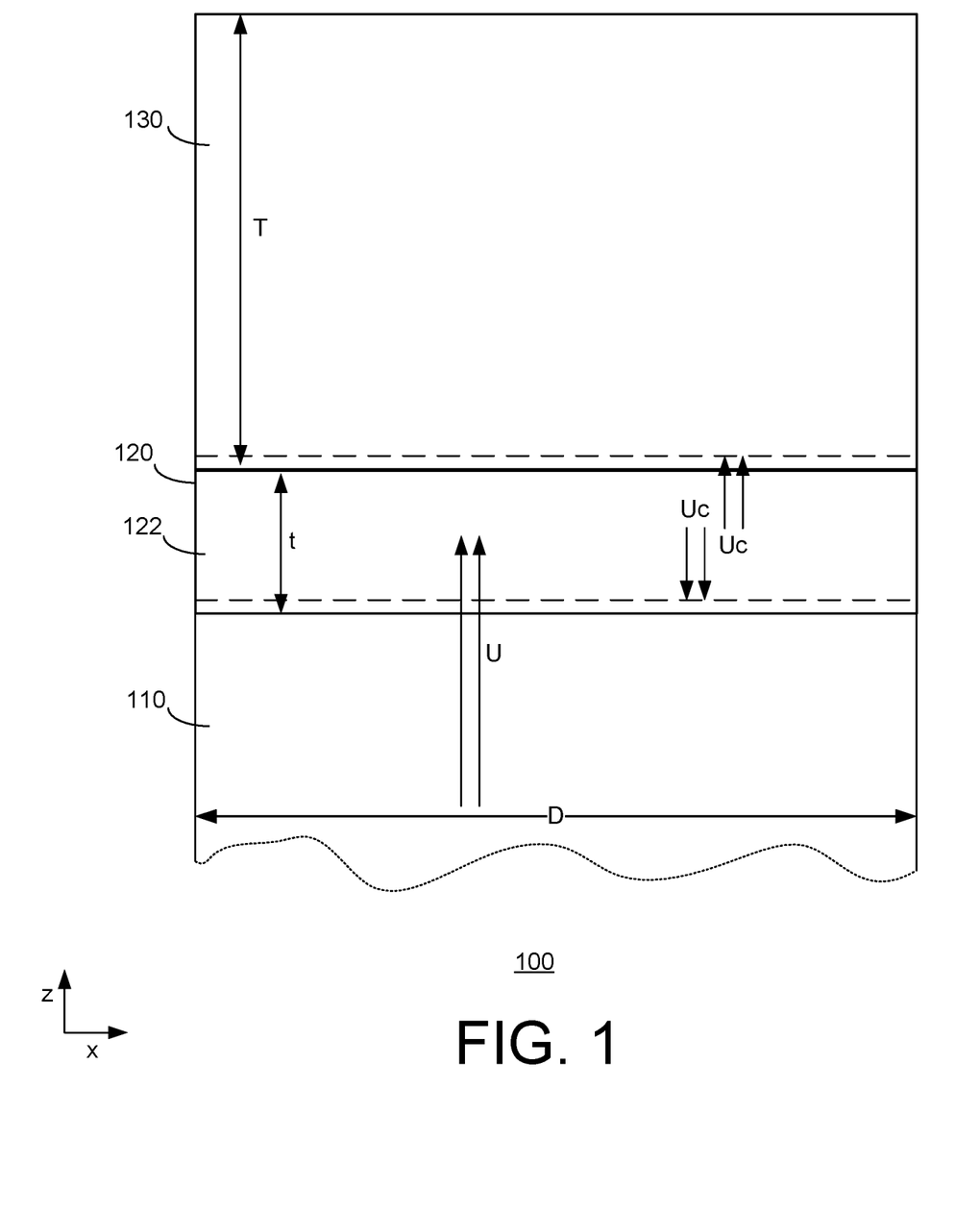
FIG. 1 illustrates a cross sectional view of a substrate with a device layer prepared for fabricating a MOSFET device.

FIG. 1 shows a cross sectional view of a substrate 100 with a device layer prepared for fabricating structures of a MOSFET device, in accordance with the principles of the present disclosure.

Substrate 100 may include a silicon wafer 110 (e.g., a highly doped n$^+$ silicon wafer). A first epitaxial layer 120 and a second epitaxial layer 130 are disposed on silicon wafer 110. First epitaxial layer 120 may include an ion-implanted capping layer 122 (e.g., an arsenic-implanted n+ doped buried layer). Second epitaxial layer 130 may function (e.g., serve) as a device layer in which structures (e.g., source region, body region, drift region, gate region, gate trenches, isolation trenches, etc.) of a MOSFET device can be fabricated.

In example implementations, silicon wafer 110 may be a heavily doped n+ wafer (e.g., a phosphorus doped wafer) having a diameter D (e.g., an industry-standard diameter). For example, silicon wafer 110 may be a 300 mm standard diameter wafer, a 200 mm standard diameter wafer, a 125 mm standard diameter wafer, a 100 mm standard diameter wafer, etc. Even the smallest diameter silicon wafers can have thicknesses of the order of hundreds of microns. For reasons of scale, only a top portion of silicon wafer 110 is shown in FIG. 1. In example implementations, silicon wafer 110 may be a heavily phosphorus-doped 300 mm diameter wafer or a heavily phosphorus-doped 200 mm diameter wafer.

First epitaxial layer 120 and second epitaxial layer 130 (device layer) disposed on silicon wafer 110 may be epitaxial layers that are lightly doped with a same dopant (e.g., phosphorus) as silicon wafer 110. In example implementations, first epitaxial layer 120 and second epitaxial layer 130 (device layer) as first grown on silicon wafer 110 may have phosphorus dopant concentrations in a range of about $10^{+14}$ to $10^{+17}$ atoms/cm$^3$.

Ion-implanted capping layer 122 (e.g., an arsenic-implanted n+ buried layer) may be formed by implanting (and annealing) a slow diffusing dopant species (e.g., arsenic) in first epitaxial layer 120. In example implementations, ion-implanted capping layer 122 may be formed by implanting arsenic ions in first epitaxial layer 120. The implant dose may be in the range of about 1E13 atoms/cm$^2$ to 1E16 atoms/cm$^2$ (e.g., 1E15 atoms/cm$^2$). An implant energy in a range of about 40 keV to 200 keV (e.g., 80 keV) may be used for implanting the arsenic ions. An amorphous silicon layer (not shown) resulting from the arsenic implant may extend up to the surface of first epitaxial layer 120 to enable defect free recrystallization of silicon in a high temperature annealing process. In an example annealing process, an anneal temperature may be in a range of about 900° C. to 1200° C. (e.g., 1100° C.), and an anneal time may be in a range of about 30 minutes to 240 minutes (e.g., 120 minutes).

In example implementations, the substrate dopant (e.g., phosphorus) may up-diffuse (e.g., in direction U) into first epitaxial layer 120, and second epitaxial layer 130 (device layer) due to thermal effects in semiconductor fabrication processes for substrate preparation and device fabrication. The up-diffusion of the substrate dopant (e.g., phosphorus) into second epitaxial layer 130 (device layer) may be substantially contained within first epitaxial layer 120 having a thickness t. The thickness t of first epitaxial layer 120 may be selected so that first epitaxial layer 120 (including capping layer 122) contains all (e.g., substantially all) up-diffusion of the substrate dopant (e.g., phosphorus) during device fabrication steps (e.g., during growth of epitaxial layer 130, and further device fabrication steps). Implanted dopant (e.g., arsenic) in capping layer 122 will diffuse into first epitaxial layer 120 towards substrate 110, and into second epitaxial layer 130 during growth of second epitaxial layer 130 and subsequent device fabrication. In FIG. 1 up-diffusion of the substrate dopant (e.g., phosphorus) is schematically depicted by arrows U, and up-diffusion of the ion-implanted dopant (e.g., arsenic) is schematically depicted by arrows Uc toward second epitaxial layer 130 and first epitaxial layer 120.

Device structures of a MOSFET device (e.g., a source region, a body region, a gate trench, a drift region, etc.)(not shown) may be fabricated in second epitaxial layer 130 on substrate 100. A thickness T of second epitaxial layer 130 (device layer), and a dopant concentration in second epitaxial layer 130 (device layer) may be selected in consideration of a breakdown voltage and the Rds(on) of the MOSFET device.

Figure 2:
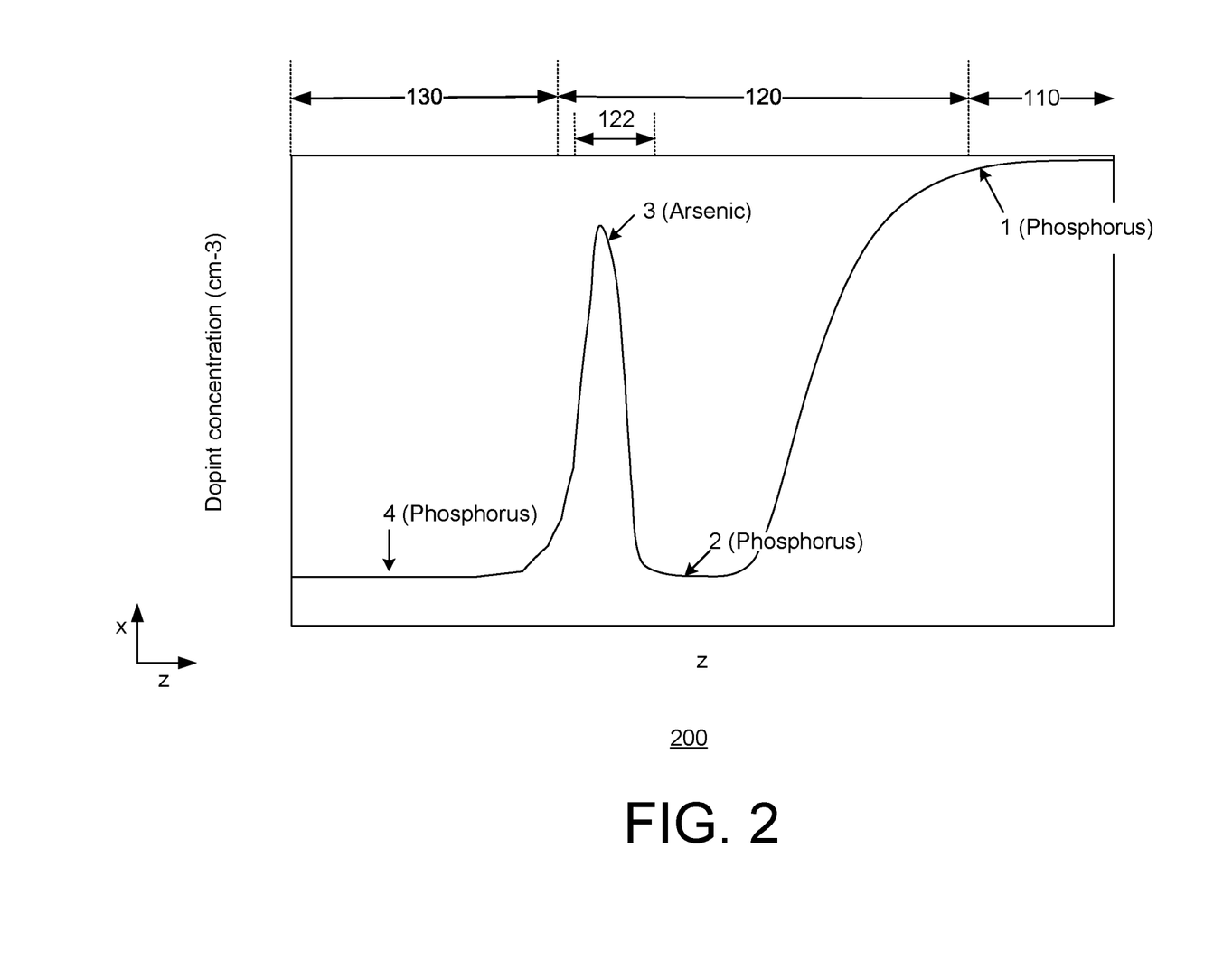
FIG. 2 illustrates an example active dopant concentration profile in a vertical direction through the substrate of FIG. 1.

FIG. 2 shows, for example, an example active dopant concentration profile 200 of substrate 100 before device fabrication in a semilogarithmic plot (in which distances are plotted on a linear scale and dopant concentrations (e.g., in a range of about $10^{+16}$ atoms/cm$^3$ to $10^{+20}$ atoms/cm$^3$) are plotted on a logarithmic scale)). As shown in FIG. 2, profile 200 extends in a vertical direction through silicon wafer 110, first epitaxial layer 120 (including ion-implanted capping layer 122) and second epitaxial layer 130 in substrate 100. As indicated in FIG. 2 by labeled arrows 1 (Phosphorus), 2 (Phosphorus), and 4 (Phosphorus), a predominant active dopant in silicon wafer 110, first epitaxial layer 120 excluding ion-implanted capping layer 122, and second epitaxial layer 130 may be phosphorus. Further, as indicated in FIG. 2 by labeled arrow 3 (Arsenic), a predominant active dopant in and about ion-implanted capping layer 122 may be arsenic.

In the example shown in FIG. 2, silicon wafer 110 may have a phosphorus dopant concentration, for example, of about $10^{+20}$ atoms/cm$^3$. First epitaxial layer 120 may have a phosphorus dopant concentration between $10^{+14}$ atoms/cm$^3$ and $10^{+17}$ atoms/cm$^3$. Ion-implanted capping layer 122 may have a peak arsenic dopant concentration, for example, of about $10^{+19}$ atoms/cm$^3$, and second epitaxial layer 130 may have a phosphorus dopant concentration, for example, between $10^{+14}$ atoms/cm$^3$ and $10^{+17}$ atoms/cm$^3$. Due to high temperature steps involved in the growth of first epitaxial layer 120 and second epitaxial layer 130, the phosphorus dopants from substrate 110 may up-diffuse into first epitaxial layer 120, decreasing from a high of about $10^{+20}$ atoms/cm$^3$ in substrate 110 to the first epitaxial layer concentration, and the ion-implanted arsenic capping layer 122 may up-diffuse into second epitaxial layer 130.

In some implementations, second epitaxial layer 130 may be formed of two or more epitaxial sublayers (not shown) each having different doping concentrations. In some other implementations (not shown), second epitaxial layer 130 may have a graded doping profile (e.g., with a dopant concentration decreasing from a high value near first epitaxial layer 120 to a lower value toward a top surface away from first epitaxial layer 120).

Figure 3:
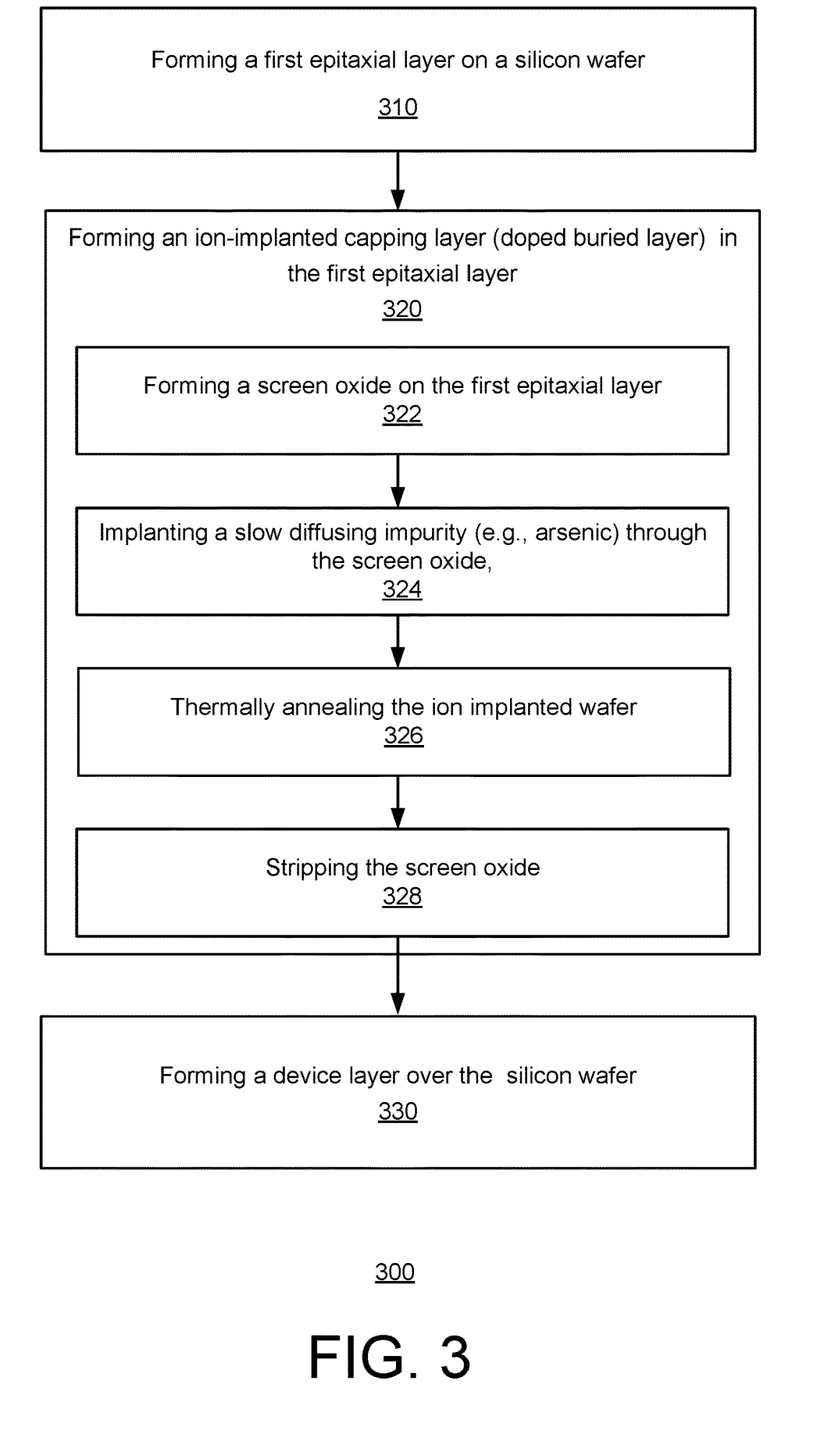
FIG. 3 illustrates an example method for preparing a substrate for MOSFET device fabrication.

FIG. 3 shows an example method 300 for preparing a substrate (e.g., substrate 100) for MOSFET device fabrication, in accordance with the principles of the present disclosure. Method 300 includes forming (e.g., growing) a first epitaxial layer on a silicon wafer (310), and forming an ion-implanted capping layer (doped buried layer) in the first epitaxial layer (320). The silicon wafer may be heavily doped with a fast diffusing impurity (e.g., phosphorus). The first epitaxial layer may be initially doped with the same fast diffusing impurity (e.g., phosphorus). The ion-implanted capping layer may be doped with a slow diffusing impurity (e.g., arsenic). The fast diffusing impurity (e.g., phosphorus) and the slow diffusing impurity (e.g., arsenic) may be of the same conductivity type (e.g., n-type).

Forming the ion-implanted capping layer (doped buried layer) in the first epitaxial layer 320 may include forming (e.g., growing) a screen oxide on the first epitaxial layer (322), implanting the slow diffusing impurity (e.g., arsenic) through the screen oxide (324), thermal annealing of the ion implanted wafer (326), and stripping the screen oxide (328). In example implementations, the screen oxide may have a thickness in a range of about 10 nm to 50 nm.

In some example implementations, implanting the slow diffusing impurity (e.g., arsenic) through the screen oxide 324 may include implanting a single dose of arsenic at a single implantation energy into the first epitaxial layer. In some example implementations, implanting the slow diffusing impurity (e.g., arsenic) through the screen oxide 324 may include implanting multiple doses of arsenic at multiple implantation energies into the first epitaxial layer.

Method 300 may further include forming a device layer over the silicon wafer (including the ion-implanted capping layer) (330). Forming the device layer may include forming (e.g., growing) a second epitaxial layer with a fast diffusing impurity (e.g., phosphorus) as a dopant.

In example implementations, a drain region of a MOSFET device (e.g., a vertical MOSFET device) may be formed in the silicon wafer. Further, other device structures (e.g., a source region, a gate trench, a drift region, etc.) of the MOSFET device (e.g., a vertical MOSFET device) may be built in the second epitaxial layer. For example, a drift region of the MOSFET device fabricated on the substrate may extend over portions of the device layer/second epitaxial layer 330. A thickness T of the device layer (second epitaxial layer) may be selected in consideration of a breakdown voltage of the MOSFET device.

In example implementations, as shown in FIG. 1, up-diffusion of the substrate dopant (e.g., phosphorus) may be substantially contained in the first epitaxial layer 120 at or below the doped buried layer (implanted with slow diffusing impurity (e.g., arsenic)) and may not extend into the device layer (second epitaxial layer 130).

Figure 4:
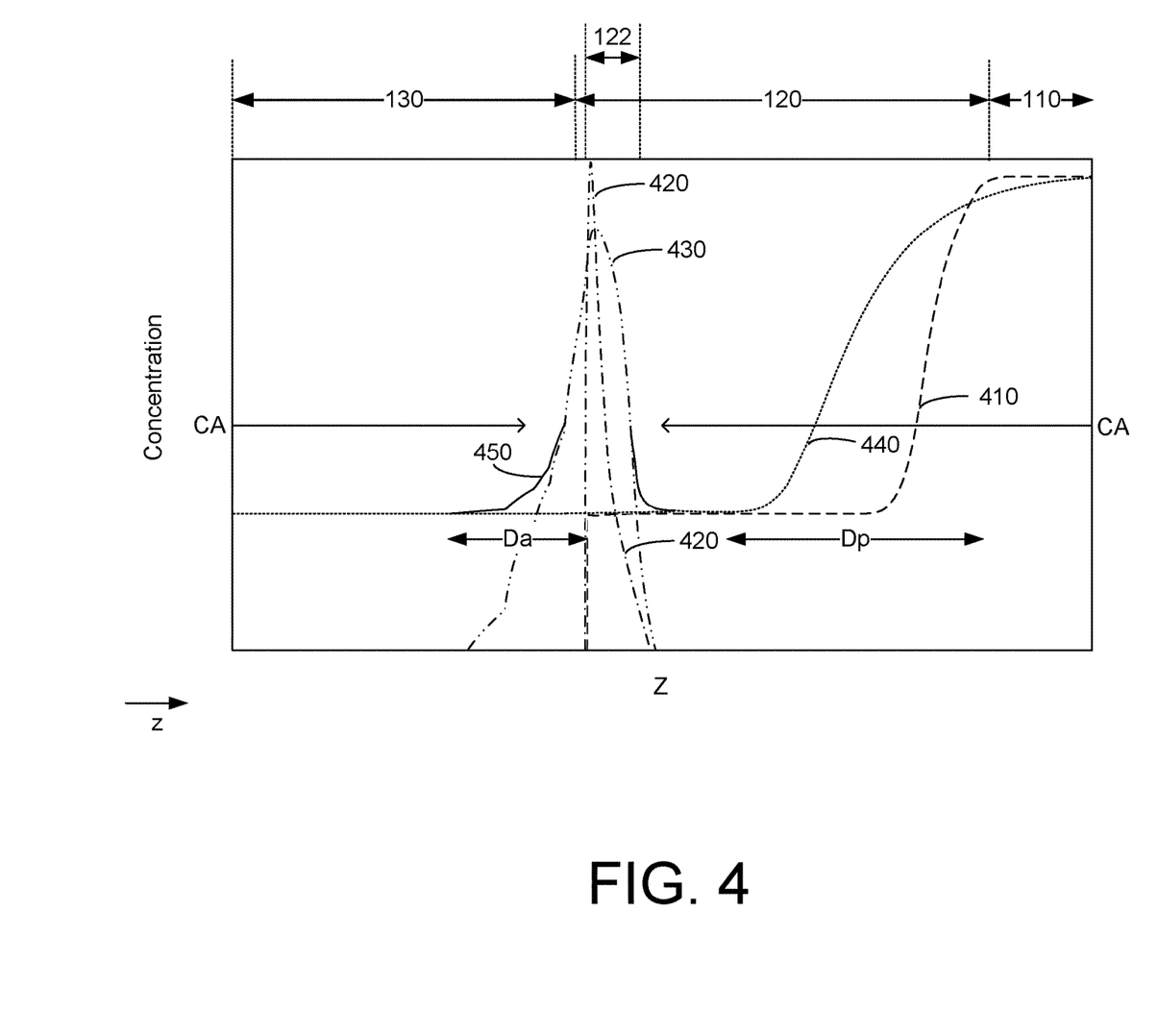
FIG. 4 illustrates example arsenic and phosphorus dopant concentration profiles in a vertical direction through the substrate of FIG. 1 as the substrate is being prepared.

FIG. 4 illustrates example arsenic and phosphorus dopant concentration profiles in a vertical direction through the substrate of FIG. 1 as the substrate is being prepared for MOSFET device fabrication. FIG. 4 is a semilogarithmic plot in which distances are plotted on a linear scale and dopant concentrations (e.g., in a range of about $10^{+15}$ atoms/cm$^3$ to $10^{+20}$ atoms/cm$^3$) are plotted on a logarithmic scale.

The example arsenic and phosphorus dopant concentration profiles shown in FIG. 4 include profile 410, profile 420, profile 430, profile 440 and profile 450 extending in a vertical direction (z-axis) through silicon wafer 110, first epitaxial layer 120 and second epitaxial layer 130 in substrate 100.

Dopant concentration profile 410 shows net active dopant concentrations (e.g., active phosphorus concentration) in silicon wafer 110 and first epitaxial layer 120 after growth of the first epitaxial layer (e.g., after step 310, method 300).

Dopant concentration profile 420 shows an arsenic dopant concentration in silicon wafer 110, and first epitaxial layer 120 after the arsenic ion implantation to form ion-implanted doped buried layer 122 in first epitaxial layer 120 (e.g., at step 324, method 300).

Dopant concentration profile 430 shows the arsenic dopant concentration across the portion of silicon wafer 110, first epitaxial layer 120, and second epitaxial layer 130, after thermal annealing of the ion-implanted wafer (e.g., at step 326, method 300) and after forming a device layer (i.e., second epitaxial layer 130) over the ion-implanted doped buried layer 122 (e.g., at step 330, method 300).

Dopant concentration profile 440 shows phosphorus dopant concentration across silicon wafer 110, first epitaxial layer 120, and second epitaxial layer 130, after forming the device layer (i.e., second epitaxial layer 130) over the ion-implanted capping layer 122 (e.g., at step 330, method 300). Profile 440 represents the phosphorus dopant concentrations after up-diffusion of phosphorus dopant from the substrate due to thermal processes for arsenic ion implementation and annealing (for forming ion-implanted capping layer 122) and forming epitaxial layer 130. As shown by profile 440, phosphorus dopant concentrations decreases from a high-dopant concentration value in substrate 110 to a small (or a negligible value) in epitaxial layer 120 over a distance Dp before device layer 130. In other words, up-diffusion of phosphorus is contained in epitaxial layer 120 (e.g. within a distance Dp) and the phosphorus up-diffusion does not extend beyond ion-implanted capping layer 122 into the device layer (i.e., second epitaxial layer 130).

Dopant concentration profile 450 shows the net dopant concentration (e.g. arsenic, and phosphorus) across silicon wafer 310, first epitaxial layer 120, and second epitaxial layer 130, after forming the device layer (i.e., second epitaxial layer 130) over the ion-implanted capping layer 122 (e.g., at step 330, method 300). Peak portions of dopant concentration profile 450 may be substantially similar to, and overlap, peak portions of dopant concentration profile 430 at concentrations greater than, for example, a concentration CA. In FIG. 4, profile 450 is depicted by a solid line and profile 430 is depicted by a dash-dot-dot line. Only profile 430 is shown above concentration CA. Profile 450 is not visible above concentration CA because it is hidden under the depiction of dopant concentration profile 430. Only non-overlapping portions of profile 450 and profile 430 are visible below concentration CA.

As seen in FIG. 4, profile 450 has a steep gradient transitioning into the device layer (i.e., second epitaxial layer 130) from the high doping concentration of the ion-implanted capping layer 122 to a low value of the dopant concentration in the device layer (i.e., second epitaxial layer 130) over a distance Da. The out diffusion extends only over a small distance Da because of the low diffusivity of the ion-implanted dopant (e.g., arsenic), and does not appear to affect the dopant concentration in second epitaxial layer 130 outside of distance Da. In other words, out-diffusion of dopants (e.g., arsenic) from first epitaxial layer 120 (including ion-implanted capping layer 122) due to thermal processes for forming epitaxial layer 130 is small and limited.to distance Da. MOSFET devices (e.g., vertical trench MOSFET devices) with low Rds(on) values may be fabricated (e.g., in a semiconductor fabrication facility) in substrate 100 (FIG. 1).

Figure 5A:
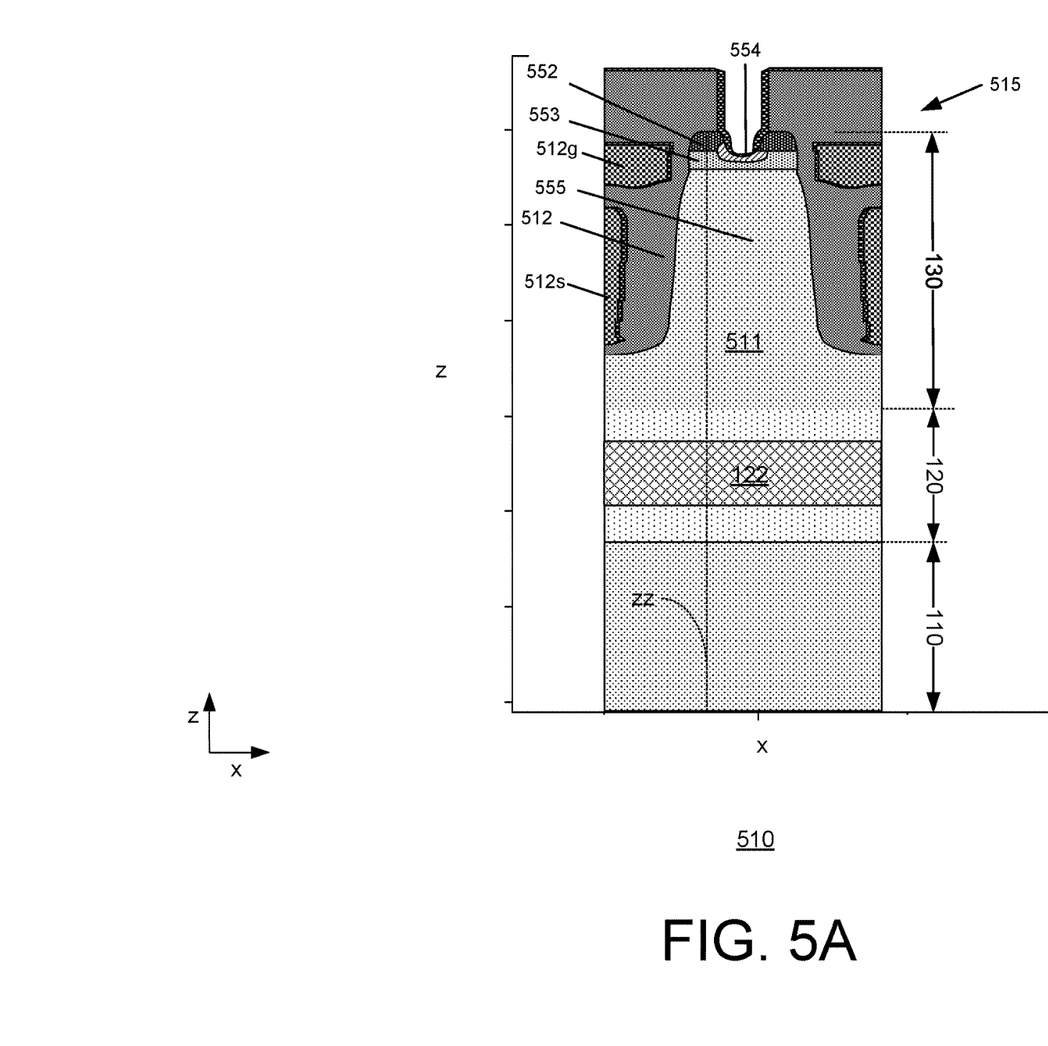
FIG. 5A illustrates a cross sectional view of a MOSFET device fabricated in a substrate having the example dopant concentration profiles shown in FIG. 4.

FIG. 5A shows a cross sectional view of a MOSFET 510 fabricated, for example, in substrate 100 having the example dopant concentration profiles 410, 420, 430, 440 and 450 shown in FIG. 4.

Substrate 100 may be processed to form trench structures 515 in the second epitaxial layer 130. The trench structures 515 may, for example, include mesas (e.g., mesa 511) formed between vertical trenches 512 formed in second epitaxial layer 130 of substrate 100.

As shown in FIG. 5A, MOSFET device 510 may include a mesa 511 separated by vertical trenches 512 formed in second epitaxial layer 130 of substrate 100. Trenches 512 may include a lower shield electrode 512s and an upper gate electrode 512g. In some implementations, lower shield electrode 512s may not be present (not shown). Mesa 511 may, for example, include the doped regions for forming a channel of the MOSFET device (e.g., source region 552, body region 553, source and body contact 554, and drift region 555, etc.) of MOSFET 510. In example implementations, source region 552 may be heavily doped with an n-type dopant (e.g., arsenic or phosphorus) and body region 553 may be doped with p-type dopant (e.g., boron).

Figure 5B:
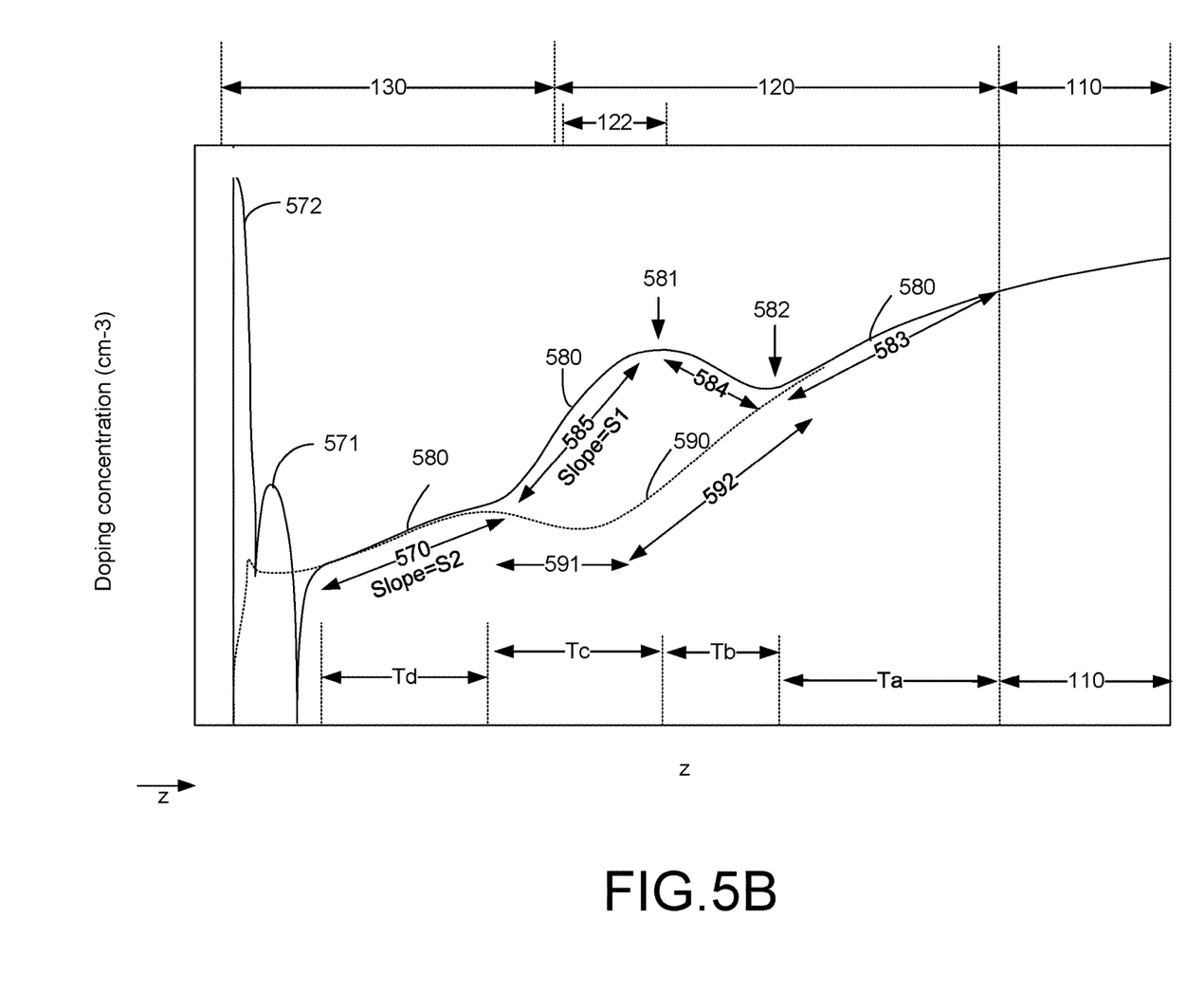
FIG. 5B illustrates an example arsenic dopant concentration profile and an example phosphorus dopant concentration profile in substrate after the MOSFET device of FIG. 5A is fabricated.

FIG. 5B shows, for example, an example total (or net) dopant concentration profile 580 and an example phosphorus dopant concentration profile 590, in substrate 100 after MOSFET 510 is fabricated. FIG. 5B is a semilogarithmic plot in which distances are plotted on a linear scale and dopant concentrations (e.g., in a range of about $10^{+15}$ atoms/cm$^3$ to $5 \times 10^{+20}$ atoms/cm$^3$) are plotted on a logarithmic scale. Net dopant concentration profile 580 and phosphorus dopant concentration profile 590 may represent the final doping concentrations after all processing steps for fabricating MOSFET device 510 including thermal processes that may drive dopant diffusion are completed.

As shown in FIG. 5B, profile 580 and profile 590, extend in a vertical direction (z-axis, along line zz, FIG. 5A) through silicon wafer 110, first epitaxial layer 120, and through the device structures (e.g., drift region 555, body region 553, and source region 552, FIG. 5A) formed in mesa 511 (second epitaxial layer 130) in substrate 100. Portions 570, 571 and 572 of net dopant concentration profile 580 may represent the final doping concentrations in drift region 555, body region 553, and source region 552, respectively. Portions 571 may represent concentrations of the p-type dopant (e.g., boron) that may be used to dope body region 553, and portion 572 may represent concentrations of the n-type dopant (e.g., phosphorus or arsenic) that may be used to dope source region 553.

As shown in FIG. 5B, in the vertical direction (–z-axis), net dopant concentration profile 580 shows a decreasing concentration over a portion 583 (e.g., over a thickness Ta) in first epitaxial layer 120 from a high concentration (e.g., $\sim 10^{+19}$ atoms/cm$^3$) in silicon wafer 110 to a lower concentration (e.g., $\sim 3 \times 10^{+17}$ to $3 \times 10^{+18}$ atoms/cm$^3$) in a valley 582 just before ion-implanted capping layer 122. Net dopant concentration profile 580 then rises from valley 582 (to the left of ion-implanted capping layer 122) over a portion 584 (e.g., over a thickness Tb) to a peak concentration (e.g., $\sim 1 \times 10^{+18}$ to $5 \times 10^{19}$ atoms/cm$^3$) at peak 581 (e.g., in ion-implanted capping layer 122) before decreasing with a steep downward gradient or slope S1 over portion 585 (e.g., over a thickness Tc) toward a lower concentration (e.g., less than $2\text{-}3 \times 10^{+17}$ atoms/cm$^3$) in second epitaxial layer 130 (i.e., in portion 570 (e.g., over a thickness Td) across drift region 555 (FIG. 5A) in second epitaxial layer 130).

As seen in FIG. 5B, in the vertical direction (–z-axis) from the silicon wafer, phosphorus dopant concentration profile 580 shows up-diffusion of phosphorus from the silicon wafer 100 into first epitaxial layer 120 from a high concentration (e.g., $\sim 10^{+19}$ atoms/cm$^3$) at silicon wafer 110 to a lower concentration (e.g., $\sim 1 \times 10^{+17}$ atoms/cm$^3$) within the ion-implanted capping layer 122.

From about peak 581 toward second epitaxial layer 130, phosphorus dopant concentration profile 590 has a relatively flat portion (e.g., portion 591) indicating that up-diffusion of phosphorus is effectively contained in first epitaxial layer 120 (including arsenic ion-implanted capping layer 122) of thickness t.

Portion 570 of net dopant concentration profile 580 (across drift region 555 in second epitaxial layer 130, FIG. 5A) may determine the device characteristics (e.g., Rds(on) and BVDSS) of MOSFET 510. The dopant concentrations in portion 570 shown in FIG. 5B include the epitaxial dopant concentrations (e.g., phosphorus) of second epitaxial layer 130 and the up-diffusion of dopants (e.g., arsenic) from ion-implanted capping layer 122 (which is more controlled, and has a steep downward gradient S1 into second epitaxial layer 130 because of the slow-diffusing characteristics of arsenic). In example implementations, dopant concentrations in portion 570 may include contributions from one or more additional phosphorus implants for tailoring the dopant concentration values in the drift region (e.g., region 511) for the BVDSS and Rds(on) of the device. The dopant concentrations in portion 570 may have a small downward gradient or slope S2 extending toward portion 571 and portion 572 of net dopant concentration profile 580). As shown in FIG. 5B, gradient or slope S2 in portion 570 may be substantially smaller than gradient or slope S1 in portion 585.

On comparing concentrations of the phosphorus dopants in silicon wafer 110, first epitaxial layer 120 and second epitaxial layer 130, shown in FIG. 5B, it is seen that phosphorus dopants up-diffuse from the heavily phosphorus-doped silicon wafer 110 into first epitaxial layer 120 up to about arsenic ion-implanted capping layer 122. The up-diffusion of phosphorus from the heavily phosphorus-doped silicon wafer 110 does not extend past arsenic ion-implanted capping layer 122. The phosphorus dopant concentrations (e.g., ~$1\times10^{+17}$ atoms/cm$^3$) in second epitaxial layer 130 (immediately to the left of arsenic ion-implanted capping layer 122 in FIG. 5B) are at least one order of magnitude lower than the phosphorus dopant concentrations (e.g., ~$1-5\times10^{+18}$ atoms/cm$^3$) in first epitaxial layer 120 (immediately to the right of arsenic ion-implanted capping layer 122 in FIG. 5B). In other words, up-diffusion of phosphorus from the heavily phosphorus-doped silicon wafer 110 into the second epitaxial layer 130 is effectively contained in first epitaxial layer 120 (including the ion-implanted capping layer 122).

As shown in FIG. 5B, net dopant concentration profile 580 in arsenic ion-implanted capping layer 122 has a peak a dopant concentration (at peak 581) between, for example $1-5\times10^{+18}$ and $5\times10^{+19}$ atoms/cm$^3$. This dopant concentration range of arsenic may be most effective in reducing the Rds(on) of the MOSFET, compared to the graded doping profile of the phosphorus up-diffusion without the arsenic implanted layer 122.

Further, a dopant concentration (at peak 581) between, for example $1-5\times10^{+18}$ and $5\times10^{+19}$ atoms/cm$^3$ in arsenic ion-implanted capping layer 122 in conjunction with the phosphorus up-diffusion into first epitaxial layer 120 may provide high conductivity paths to ohmic drain contacts (not shown) formed in silicon wafer 110.

In example implementations, first epitaxial layer 120 may have a thickness, for example, in a range of about 2 µm to 8 µm, and second epitaxial layer 130 may have a thickness, for example, in a range of about 2 µm to 15 Dopant concentration profile 580 may have a decreasing value in first epitaxial layer 120 from silicon wafer 110 to valley region 582 over portion 583 having a thickness Ta, for example, of about 1 µm to 8 µm; an increasing value from valley region 582 to peak 581 over portion 584 having a thickness Tb, for example, of about 0.5 µm to 2 µm; and a decreasing value with a slope S1 from peak 581 into the second epitaxial layer 130 over portion 585 having a thickness Tb, for example, of about 0.2 µm to 2 µm. Further, dopant concentration profile 580 may be relatively flat or have a small downward slope S2 in the second epitaxial layer 130 over portion 570 having a thickness Td, for example, of about 0.5 µm to 15 µm.

In example implementations, a series of multiple arsenic implantations may be used to form a wider and deeper (closer to the silicon wafer 110) ion-implanted capping layer 122 in first epitaxial layer 120 (e.g., at step 324, method 300), High energy implants may be used to place arsenic atoms deeper in first epitaxial layer 120 (to reduce or minimize dip or valley region 582 seen, for example, in arsenic dopant concentration profile 580, FIG. 5B).

In example implementations, the series of multiple arsenic implantations may include a surface arsenic implant to set a doping level and a gradient of arsenic atoms into second epitaxial layer 130, and one or more high energy (HE) implants to place arsenic atoms deeper in first epitaxial layer 120 than the surface arsenic implant. The one or more HE implants may reduce a dip (e.g., dip or valley region 582) in the net dopant profile (e.g., profile 580, FIG. 5B) toward silicon wafer 110. In example implementations, three arsenic implantation scenarios for creating a capping layer (e.g., ion-implanted capping layer 122) in first epitaxial layer 120 may be considered: (1) a single surface ion implant 5E14, 80 keV; (2) one additional HE (750 keV) ion implant, 5E14, 80 keV+1E14, 750 keV; and (3) one additional HE (1.5 MeV) ion implant, 5E14, 80 keV+1E14, 1.5 MeV.

Figure 6A:
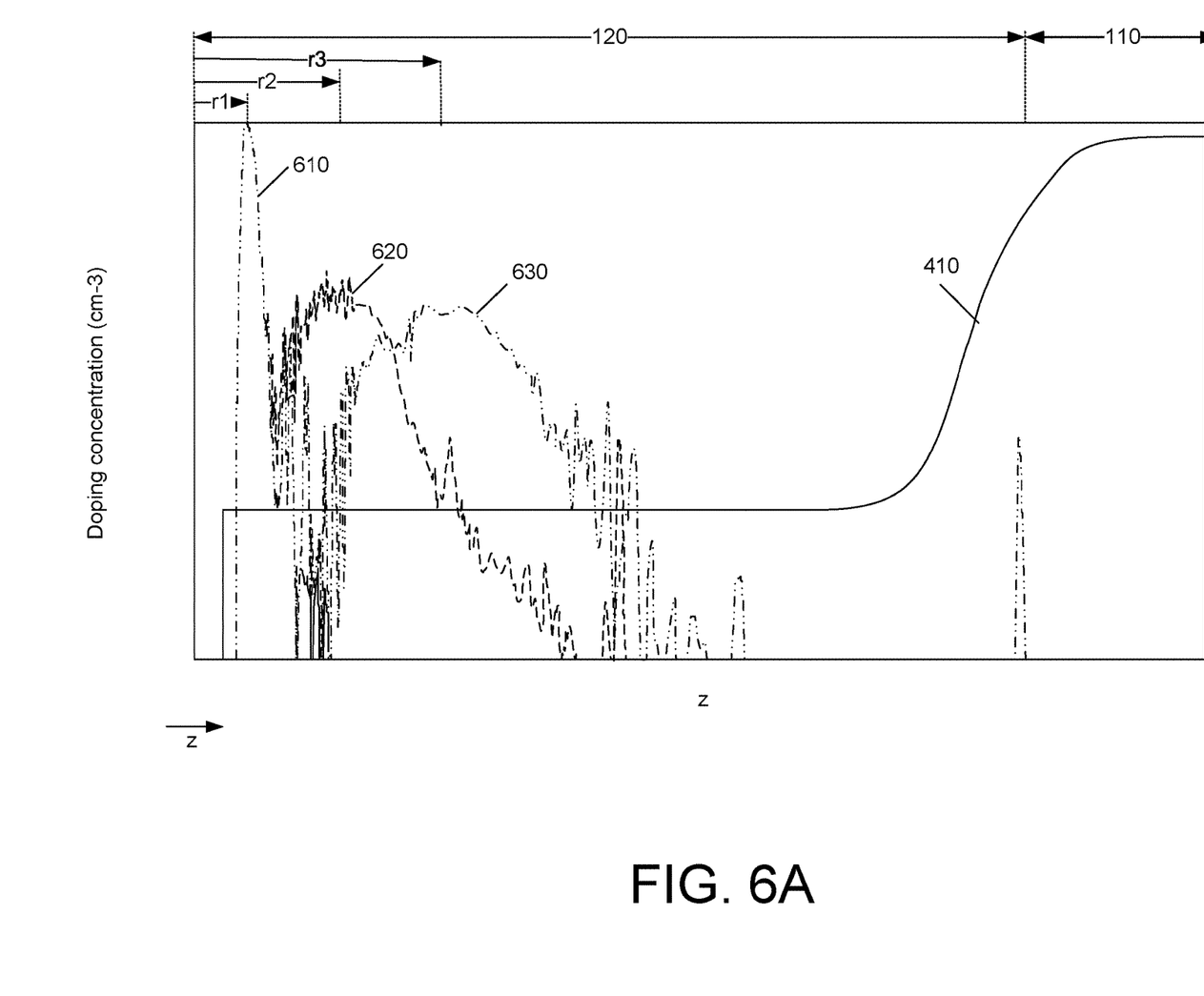
FIG. 6A illustrates example pre-annealing implanted arsenic concentration profiles for three implantation scenarios of creating an arsenic-doped capping layer in a substrate.

FIG. 6A shows example pre-annealing implanted arsenic concentration profiles (e.g., profiles 610, 620 and 630) in first epitaxial layer 120 for the three foregoing example implantation scenarios superimposed on profile 410 of phosphorus concentration in silicon wafer 110 and first epitaxial layer 120 after growth of the first epitaxial layer (FIG. 4). FIG. 6A is a semilogarithmic plot in which distances are plotted on a linear scale and dopant concentrations (e.g., in a range of about $10^{+15}$ atoms/cm$^3$ to $10^{+20}$ atoms/cm$^3$) are plotted on a logarithmic scale.

For example, profile 610 shows implanted arsenic concentrations for the single surface ion implant: 1E15, 80 keV. Profile 620 shows implanted arsenic concentrations for the additional HE (keV) ion implant: 1E14, 750 keV. Profile 630 shows implanted arsenic concentrations for the additional HE (MeV) ion implant: 1E14, 1.5 MeV. FIG. 6A also shows, for example, a profile 640 representing pre-annealing phosphorus concentrations in first epitaxial layer 120 and silicon wafer 110. Profiles 620 and 630 also include dopant concentration contributions from the single surface ion implant: 1E15, 80 keV, but these are not shown separately in the FIG. 6A, since they are co-incident with profile 610 for the single surface ion implant: 1E15, 80 keV.

As shown in FIG. 6A, the HE implantations (1E14, 750 keV, profile 620) and (1E14, 1.5 MeV, profile 630) dispose arsenic atoms deeper (at ranges r2 and r3, respectively, proportional to implant energy) into first epitaxial layer 120 than a depth (range r1) of the surface ion implant (1E15, 80 keV, profile 610).

Figure 6B:
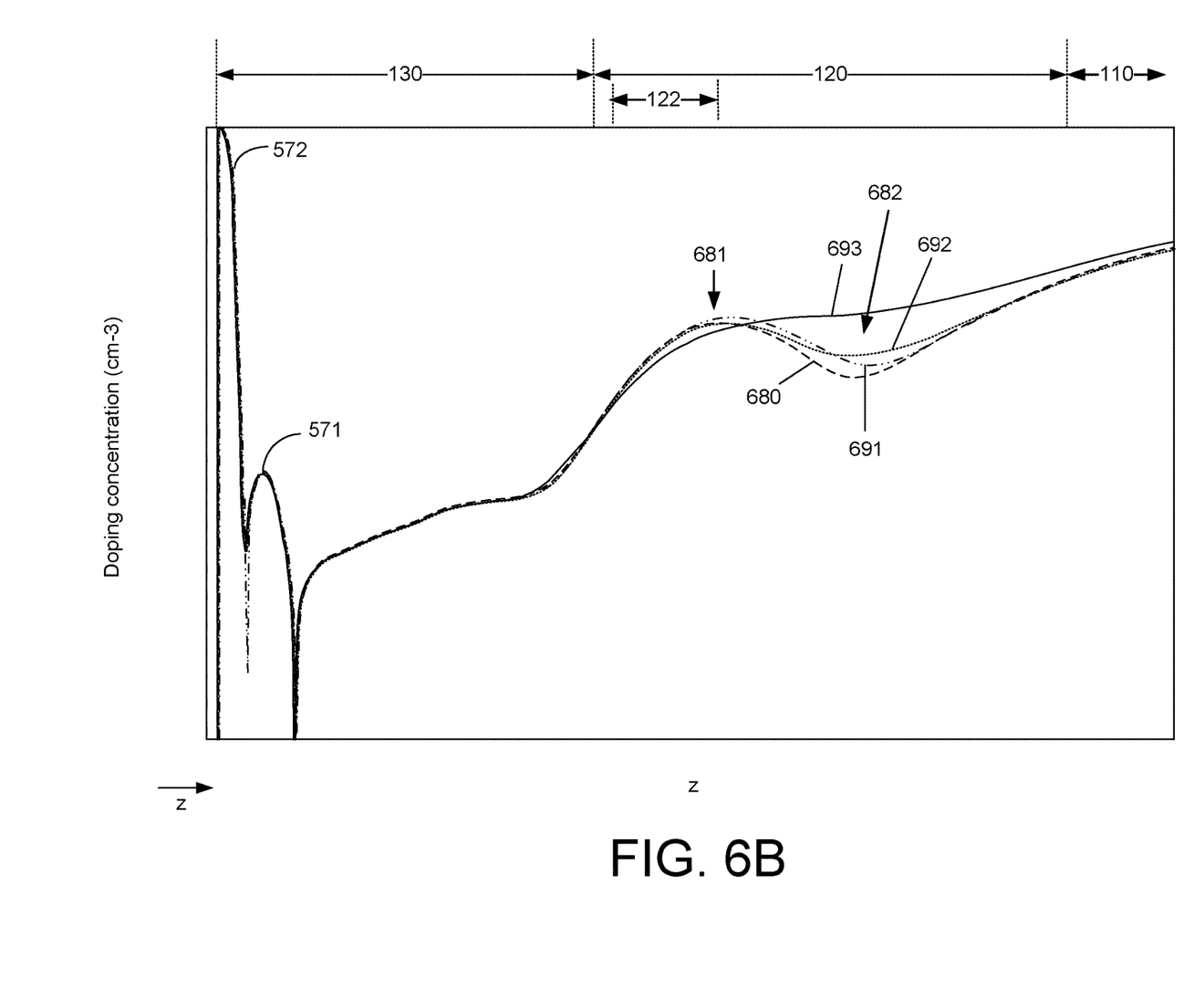
FIG. 6B illustrates example arsenic dopant concentration profiles in a MOSFET device fabricated in a substrate under the three implantation scenarios of FIG. 6A.

FIG. 6B shows, for example, example net dopant concentration profiles (e.g., profile 680, 691, 692 and 693) in a MOSFET device (e.g., MOSFET device 510, FIG. 5A) fabricated using different arsenic concentration distributions for creating capping layer 122 in first epitaxial layer 120. FIG. 6B is a semilogarithmic plot in which distances are plotted on a linear scale and dopant concentrations (e.g., in a range of about $10^{+15}$ atoms/cm$^3$ to $5\times10^{+20}$ atoms/cm$^3$) are plotted on a logarithmic scale.

The profiles plotted in FIG. 6B show the arsenic dopant concentrations extending in a vertical direction (z-axis) through silicon wafer 110, first epitaxial layer 120 and second epitaxial layer 130 in substrate 100 (FIG. 5A). The profiles represent the final doping concentrations after all processing steps for fabricating MOSFET device 510 are completed.

In FIG. 6B, profile 680 (like profile 580 in FIG. 5B) shows the net dopant concentration for the scenario where capping layer 122 is created using the single surface arsenic ion implant: 1E15 atoms/cm$^2$, 80 keV; profile 691 shows the net dopant concentration for the scenario where capping layer 122 is created using the single surface arsenic ion implant: 1E15 atoms/cm$^2$, 80 keV and an additional HE (keV) arsenic implant: 1E14 atoms/cm$^2$, 750 keV; and profile 692 shows the net dopant concentration for the scenario where capping layer 122 is created using the single surface arsenic ion implant: 1E15 atoms/cm$^2$, 80 keV and an additional HE (MeV) arsenic implant: 1E14 atoms/cm$^2$, 1.5 MeV.

In FIG. 6B, also shows profile 693 representing the net dopant concentration for a reference case where capping layer 122 (and first epitaxial layer 120) is an arsenic-doped epitaxial layer (i.e., a not-implanted arsenic doped layer).

As shown in FIG. 6B, the dopant concentration profiles 680, 691, 692 and 693 have peak regions 681, and valley regions 682 to the right of the peak regions toward silicon wafer 110. The valley regions 682 are shallower (i.e., flatter) in profiles 691 and 692 (having capping layer 122 with additional HE arsenic implants) and in profile 693 (having an arsenic-doped epitaxial layer as capping layer 122) than the valley region 682 for profile 680 (having capping layer 122 with a single surface arsenic implant). FIG. 6B suggests that flatter dopant profiles can be fabricated using multiple HE arsenic implants at different depths to create capping layer 122 for containing up-diffusion of phosphorus into first epitaxial layer 120 from silicon wafer 110.

As previously mentioned, a series of multiple arsenic implantations may be used to form a wider and deeper (closer to the silicon wafer 110) ion-implanted capping layer 122 in a single first epitaxial layer 120 (e.g., at step 324, method 300). The multiple arsenic implantations may be made in first epitaxial layer 120 through a screen oxide, which is latter stripped after annealing (e.g., at step 326, method 300).

In some example implementations, each of the arsenic implantations may be in a new epitaxial layer grown after annealing and stripping the screen oxide of the previous arsenic implantation.

Figure 7:
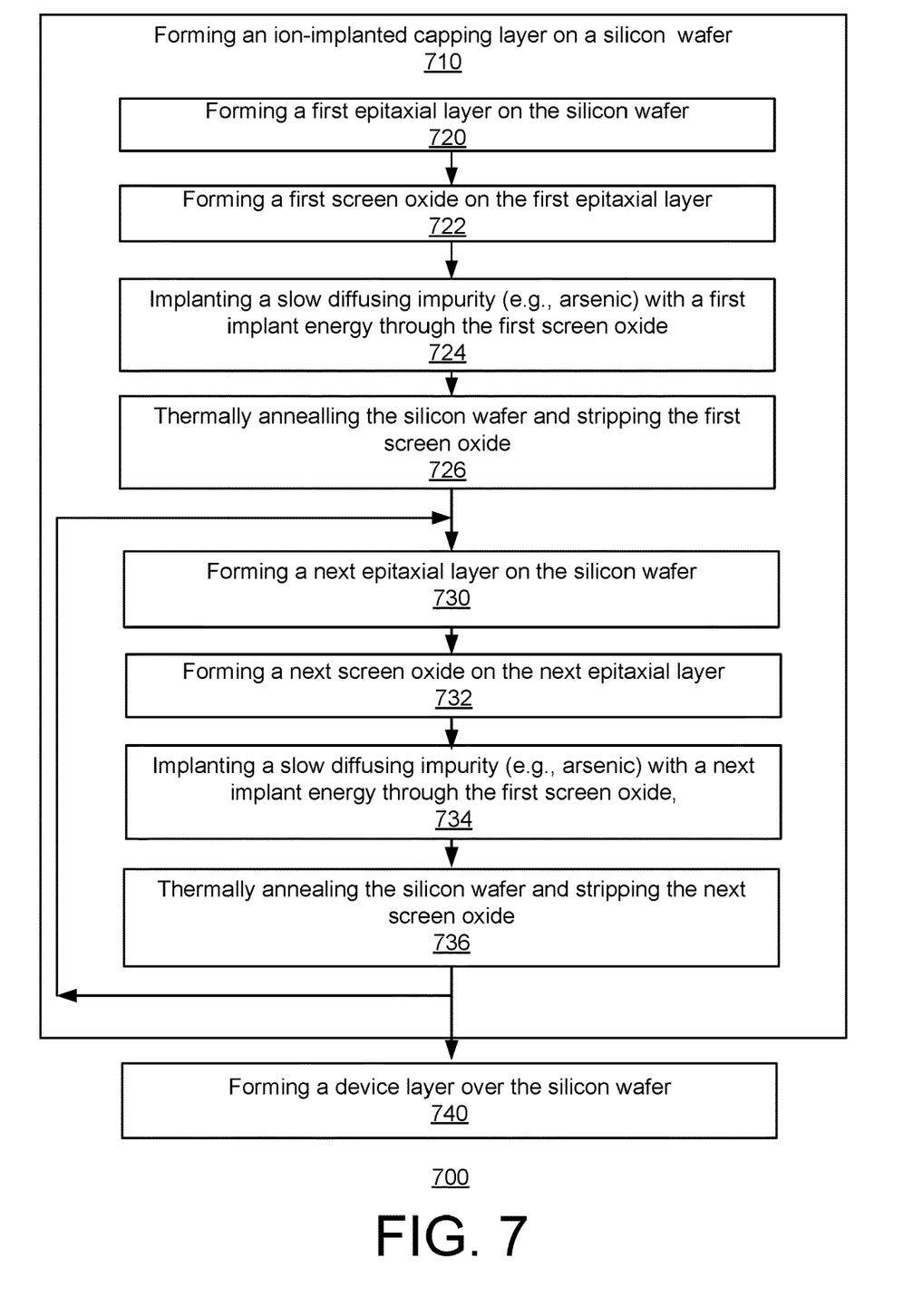
FIG. 7 illustrates an example method using multiple ion implantations for preparing a silicon substrate for MOSFET device fabrication.

FIG. 7 shows an example method 700 using a series of multiple ion implantations through multiple epitaxial layers for preparing a silicon substrate for MOSFET device fabrication, in accordance with the principles of the present disclosure.

Method 700 includes forming an ion-implanted capping layer on a silicon wafer (710). The silicon wafer may be heavily doped with a fast diffusing impurity (e.g., phosphorus). Making the ion-implanted capping layer 710 may include forming (e.g., growing) a first epitaxial layer on the silicon substrate (720). The first epitaxial layer may be initially doped with the same fast diffusing impurity (e.g., phosphorus) as the silicon substrate. Making the ion-implanted capping layer 710 may further include forming (e.g., growing) a first screen oxide on the first epitaxial layer (722), implanting a slow diffusing impurity (e.g., arsenic) with a first implant energy through the first screen oxide (724), and thermally annealing the silicon substrate and stripping the first screen oxide (726). The first implant energy may, for example, be in the range of 40 keV to 200 keV (e.g., 80 keV, etc.).

Making the ion-implanted capping layer 710 may further include forming (e.g., growing) a next epitaxial layer on the silicon substrate (730), after stripping the first screen oxide 722. The next epitaxial layer may be initially doped with the same fast diffusing impurity (e.g., phosphorus) as the silicon substrate. Making the ion-implanted capping layer 710 may further include forming (e.g., growing) a next screen oxide on the next epitaxial layer (732), implanting the slow diffusing impurity (e.g., arsenic) with a next implant energy through the next screen oxide (734), and thermally annealing the silicon substrate and stripping the next screen oxide (736). The next implant energy may, for example, be in the range of 40 keV to 200 keV (e.g., 80 keV, etc.).

Method 700 may further involve one or more iterations repeating steps 730 through step 736 (e.g., with the same or different next implant energy at step 734 in each iteration).

Method 700 for preparing the silicon substrate for MOSFET fabrication may further include forming a device layer over the silicon substrate (740).

In example implementations, the foregoing methods (e.g., method 300, FIG. 3, and method 700, FIG. 7) for preparing the silicon substrate for MOSFET fabrication may further include oxidation of the silicon substrate surface after the one or more of the arsenic implantation and annealing steps (e.g., step 324, method 300; steps 724 and 726, steps 734 and 736, method 700, etc.). Oxidation of the silicon surface may consume any residual end-of-range (EOR) damage in the silicon substrate caused by the arsenic implantation. In example implementations, a thick oxide thicker than the EOR may be grown to consume the EOR damage from the arsenic implantation. In example implementations, the thick oxide grown to consume the EOR damage may be a few thousand Angstroms thick (e.g., 1000A to 3000A thick). Wet oxidation processes may be used to grow the thick oxide at temperatures between 800° C. and 1200° C.

Implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A substrate for fabricating a vertical MOSFET device, the substrate comprising:
a silicon wafer;
a first epitaxial layer including an ion-implanted capping layer disposed on the silicon wafer, the silicon wafer and the ion-implanted capping layer being doped with dopants of a same conductivity type, the silicon wafer being doped with a first dopant to form a drain region of the vertical MOSFET device, the ion-implanted capping layer being doped with a second dopant, the first dopant having a higher diffusivity in silicon than a lower diffusivity of the second dopant in silicon; and
a second epitaxial layer disposed on the first epitaxial layer,
the first epitaxial layer including the ion-implanted capping layer having a thickness configured to contain up-diffusion of the first dopant having the higher diffusivity from the silicon wafer in the first epitaxial layer in thermal processes for fabricating the vertical MOSFET device,
the ion-implanted capping layer configured to limit up-diffusion of the first dopant from the silicon wafer through the ion-implanted capping layer into the second epitaxial layer such that a concentration of the first dopant in the second epitaxial layer is lower than a concentration of the first dopant in the first epitaxial layer.

2. The substrate of claim 1, wherein the silicon wafer is a phosphorus doped n$^+$ silicon wafer, the ion-implanted capping layer is an arsenic-implanted buried layer.

3. The substrate of claim 1, wherein the ion-implanted capping layer is formed by a dose of arsenic ions implanted in the first epitaxial layer at an implant energy.

4. The substrate of claim 3, wherein the dose is in a range of about 2E13 atoms/cm$^2$ to 1E16 atoms/cm$^2$ and the implant energy is in a range of about 60 keV to 100 keV.

5. The substrate of claim 4, wherein the ion-implanted capping layer is annealed at a temperature in a range of about 950° C. to 1200° C. for an anneal time in a range of about 30 minutes to 240 minutes.

6. The substrate of claim 4, wherein the annealed ion-implanted capping layer has a peak arsenic dopant concentration in a range of about $1 \times 10^{+18}$ to $5 \times 10^{+19}$ atoms/cc.

7. The substrate of claim 1, wherein the first epitaxial layer and second epitaxial layer as first grown on silicon wafer have phosphorus dopant concentrations in a range of about $10^{+14}$ to $10^{+17}$ atoms/cc.

8. The substrate of claim 1, wherein a mesa is formed in the second epitaxial layer, the mesa including a drift region of a MOSFET device formed on the substrate.

9. A vertical MOSFET device, the vertical MOSFET device comprising:
a heavily doped silicon substrate including a drain of the vertical MOSFET device; and
a semiconductor mesa including a drift region of the vertical MOSFET device, the semiconductor mesa disposed on a first epitaxial layer, the first epitaxial layer disposed on the heavily doped silicon substrate, the semiconductor mesa being formed in a second epitaxial layer disposed on the first epitaxial layer,
the first epitaxial layer including an ion-implanted capping layer having a thickness t configured to contain up-diffusion of a first dopant from the heavily doped silicon substrate into the first epitaxial layer in thermal processes for fabricating the vertical MOSFET device,
the ion-implanted capping layer configured to limit up-diffusion of the first dopant from the heavily doped silicon substrate through the ion-implanted capping layer into the semiconductor mesa such that a concentration of the first dopant in the semiconductor mesa is lower than a concentration of the first dopant in the first epitaxial layer.

10. The vertical MOSFET device of claim 9, wherein the heavily doped silicon substrate is a phosphorus doped n$^+$ silicon wafer, and wherein the ion-implanted capping layer is an arsenic-implanted buried layer.

11. The vertical MOSFET device of claim 10, wherein the ion-implanted capping layer in the vertical MOSFET device has a peak arsenic dopant concentration in a range of about $5 \times 10^{+17}$ to $10^{+19}$ atoms/cm$^3$.

12. The vertical MOSFET device of claim 10, wherein the ion-implanted capping layer is disposed in a first epitaxial layer grown on the phosphorus doped n$^+$ silicon wafer.

13. The vertical MOSFET device of claim 9, wherein the drift region of the vertical MOSFET device included in the semiconductor mesa has phosphorus dopant concentrations in a range of about $1 \times 10^{+15}$ to $3 \times 10^{+17}$ atoms/cm$^3$.

14. The vertical MOSFET device of claim 9, wherein a net dopant concentration profile has a decreasing value from the drain of the vertical MOSFET device to a valley region in the first epitaxial layer, an increasing value from the valley region to a peak value at a peak in the ion-implanted capping layer, and a decreasing value from the peak into the drift region of the vertical MOSFET device.

15. A MOSFET device comprising:
a drain region formed in a phosphorus doped silicon wafer;

an epitaxial layer doped with phosphorus disposed on the phosphorus doped silicon wafer;

a source region formed in a device layer disposed on the epitaxial layer doped with phosphorus; and an arsenic ion-implanted capping layer implanted in the epitaxial layer below the source region in the device layer and above the drain region formed in the phosphorus doped silicon wafer, the arsenic ion-implanted capping layer limiting up-diffusion of phosphorus dopant from the phosphorus doped silicon wafer through the arsenic ion-implanted capping layer such that a concentration of the phosphorus dopant in the device layer at or above the arsenic ion-implanted capping layer is lower than a concentration of the phosphorus dopant in the epitaxial layer below the arsenic ion-implanted capping layer.

16. The MOSFET device of claim 15, wherein the arsenic ion-implanted capping layer comprises a thermally annealed arsenic ion implanted layer.

17. The MOSFET device of claim 15, wherein the arsenic ion-implanted capping layer has a peak arsenic dopant concentration of about $5 \times 10^{+17}$ atoms/cc to $5 \times 10^{+19}$ atoms/cc.

18. The MOSFET device of claim 15, wherein the arsenic ion-implanted capping layer comprises multiple doses of arsenic ions at multiple implant energies.

19. The MOSFET device of claim 18, wherein each of the multiple doses of the arsenic ions is implanted in a new epitaxial layer grown after annealing and stripping a screen oxide of a previous arsenic implantation.

20. The MOSFET device of claim 15, wherein the device layer disposed on the epitaxial layer doped with phosphorus includes another epitaxial layer having phosphorus dopant concentrations in a range of about $10^{+15}$ to $10^{+17}$ atoms/cm$^3$.

* * * * *